United States Patent [19]

Shibata et al.

[11] Patent Number: 4,618,958

[45] Date of Patent: Oct. 21, 1986

[54] DEVICE FOR CONTROLLING THE RADIATING OUTPUT OF A SEMICONDUCTOR LASER

[75] Inventors: Isamu Shibata; Yoshiaki Kanmoto, both of Tokyo, Japan

[73] Assignee: Ricoh Co., Ltd., Tokyo, Japan

[21] Appl. No.: 699,590

[22] Filed: Feb. 8, 1985

[30] Foreign Application Priority Data

Feb. 10, 1984 [JP] Japan ................................. 59-24090
Feb. 14, 1984 [JP] Japan ................................. 59-25704
Feb. 16, 1984 [JP] Japan ................................. 59-27739

[51] Int. Cl.⁴ ............................................. H01S 3/13
[52] U.S. Cl. .......................................... 372/29; 372/38
[58] Field of Search .................. 372/29, 38, 9, 28, 26, 372/25, 30; 350/162.12, 358; 250/205

[56] References Cited

U.S. PATENT DOCUMENTS

| | | | |
|---|---|---|---|
| 3,555,453 | 1/1971 | Littauer ................................ | 372/29 |
| 3,636,250 | 1/1972 | Haeff ................................... | 372/28 |
| 3,977,788 | 8/1976 | Moore .................................. | 372/29 |
| 4,068,197 | 1/1978 | Yamazaki et al. ................... | 372/29 |
| 4,398,293 | 8/1983 | Hall et al. ........................... | 372/29 |
| 4,412,331 | 10/1983 | Chapman ............................. | 372/29 |
| 4,479,221 | 10/1984 | Kitamura ............................. | 372/31 |
| 4,488,305 | 12/1984 | Claverie et al. ..................... | 372/38 |
| 4,516,242 | 5/1985 | Yokota ................................ | 372/29 |
| 4,523,089 | 6/1985 | Maeda et al. ....................... | 372/38 |

Primary Examiner—Leon Scott, Jr.

[57] ABSTRACT

A device detects the radiating output from a semiconductor laser and compares a detected signal with a reference signal in a comparator. An up/down counter is controlled an output signal from the comparator to supply the semiconductor laser with a current proportional to a count output from the up/down counter. The current supplied to the semiconductor laser is controlled and held so as to equalize the input signals to the comparator at all times.

3 Claims, 6 Drawing Figures

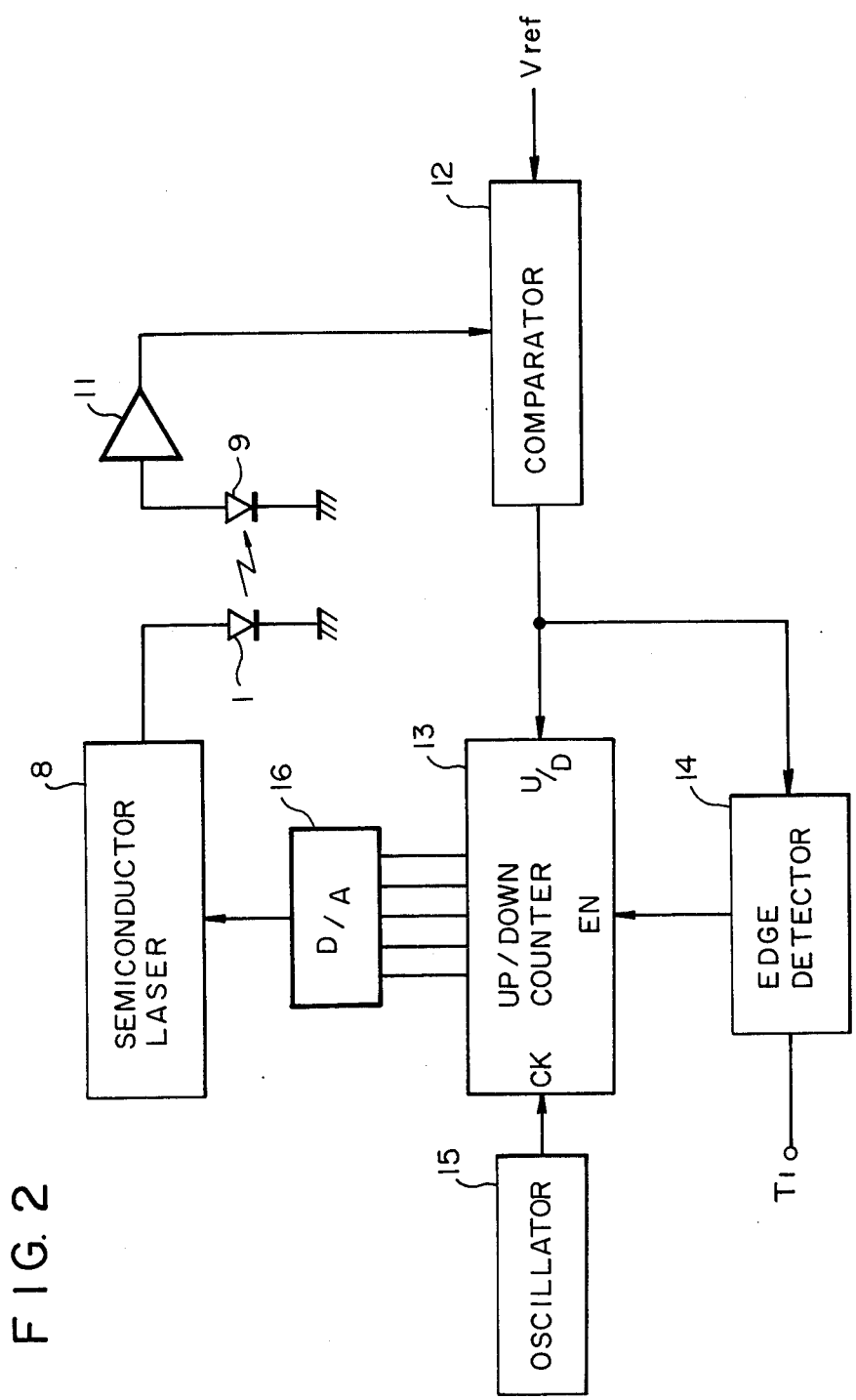
F I G. 2

DEVICE FOR CONTROLLING THE RADIATING OUTPUT OF A SEMICONDUCTOR LASER

BACKGROUND OF THE INVENTION

1. Field of the Invention

The present invention relates to a device for controlling the radiating output of a semiconductor laser for use in a laser printer, for example.

2. Description of the Prior Art

The radiating output of a semiconductor laser is highly dependent on the temperature, and should therefore be stabilized by some means in environments in which the semiconductor layer is subjected to varying ambient temperatures. There has conventionally been employed a device for controlling the radiating output of a semiconductor laser used as a light source in a laser printer. The conventional device includes a photodetector for detecting the quantity of an emitted laser beam from the semiconductor laser during a period in which the laser beam is not modulated by an information signal, each time the laser beam is scanned by a beam scanning device (or in each main scanning stroke). The control device is responsive to a detected signal from the photodetector for controlling the quantity of the laser beam emission. With this prior control system, however, the photodetector used has to be of a high response speed and hence is expensive. The semiconductor laser as it operates has its power output falling when the drive current is constant. If the semiconductor laser is in a standby mode in which no recording is effected for a long period of time, the power output of the laser is reduced to a large degree, causing a problem upon recording in a next frame.

SUMMARY OF THE INVENTION

It is an object of the present invention to provide a device for controlling the radiating output of a semiconductor laser, the device being of a reduced cost since it includes a photodetector of a relatively low response speed.

Another object of the present invention is to provide a device for controlling the radiating output of a semiconductor laser to reduce variations in the radiating output by failing to hold a drive current for the semiconductor laser continuously beyond a prescribed period of time.

Still another object of the present invention is to provide a device capable of accurately controlling the radiating output of a semiconductor laser.

According to the present invention, a device for controlling the radiating output of a semiconconductor laser includes a photodetector for detecting the radiating output of the semiconductor laser, a comparator for comparing an output signal from the photodetector with a reference signal, an up/down counter for counting clock signals in a count mode controlled by an output signal from the comparator, a digital-to-analog converter for converting a count output from the up/down counter into an analog signal, a semiconductor laser driver for supplying the semiconductor laser with a current proportional to the analog signal from the digital-to-analog converter, and means for controlling and holding the current supplied to the semiconductor laser to equalize the intut signals applied to the comparator. The device may also include means for ceasing the holding of the current supplied to the semiconductor laser.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 2 is a block diagram of the controlling device shown in FIG. 1;

DESCRIPTION OF THE PREFERRED EMBODIMENTS

Figure 1:
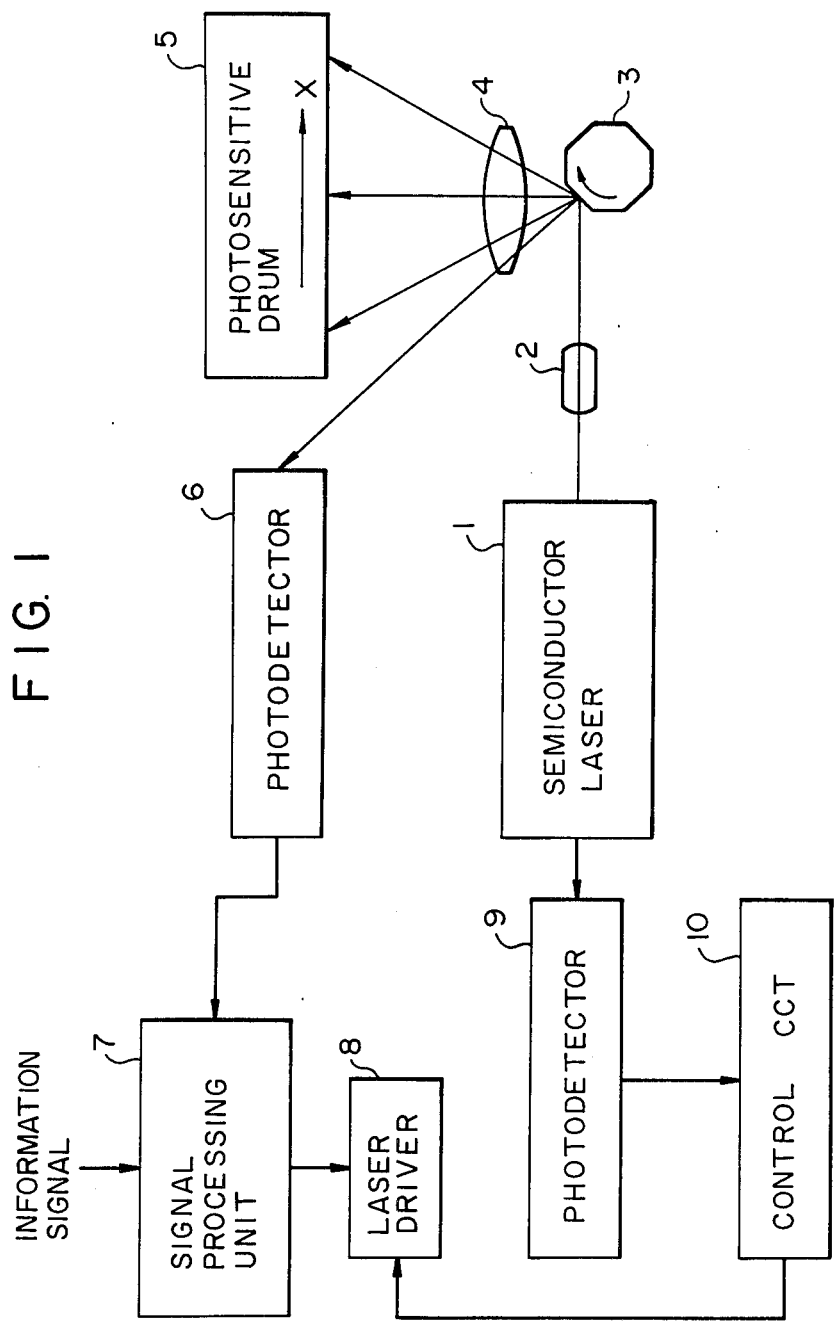
FIG. 1 is a block diagram of a laser printer incorporating therein a device for controlling the radiating output of a semiconductor laser according to the present invention.

Like or corresponding parts are denoted by like or corresponding reference characters throughout the several views.

FIG. 1 shows a laser printer incorporating therein a device for controlling the radiating output of a semiconductor laser according to the present invention.

A laser beam radiated from a semiconductor laser 1 is collimated by a collimator lens 2 and then deflected by a beam scanning device 3 composed of a rotating polygonal mirror. The deflected beam is focused by an f lens onto the charged surface of a photosensitive drum 5. Rotation of the rotating polygonal mirror 3 causes the focused spot to move in repeated successive strokes in the direction of the arrow X while at the same time the photosensitive drum 5 rotates about its own axis. A photodetector 6 is disposed out of an information writing range over the photosensitive drum 5 and detects the laser beam deflected by the rotating polygonal mirror 3 to generate a synchronizing signal. The synchronizing signal from the photodetector 6 controls the timing at which an information signal is applied by a signal processing circuit 7 to a semiconductor laser driver 8. The semiconductor laser driver 8 is responsive to the information signal from the signal processing circuit 7 for driving the semiconductor laser 1. Therefore, the laser beam as modulated by the information signal is radiated onto the photosensitive drum 5 to form an electrostatic latent image thereon. The electrostatic latent image formed on the photosensitive drum 5 is then developed by a developing unit and then transferred to a sheet of paper, for example, by a transfer unit. A laser beam emitted rearward from the semiconductor laser 1 falls on a photodetector 9 which detects the intensity of the laser beam. A control circuit 10 is responsive to an output signal from the photodetector 9 for controlling the semiconductor laser driver 8 to control the radiating output from the semiconductor laser 1 so as to be constant.

FIG. 2 shows in detail the semiconductor laser driver 8 and the control circuit 10.

The laser beam emitted rearward from the semiconductor laser 1 falls on the photodetector 9 which comprises a photodiode. The photodiode 9 then generates a current proportional to the intensity of the applied laser beam. The current from the photodiode 9 is converted by an amplifier 11 into a voltage which is compared with a reference voltage Vref by a comparator 12. An output voltage from the comparator 12 is of a high level or a low level dependent on the magnitudes of the voltages imposed on the comparator 12, and controls a count mode of an up/down counter 13. If the intensity of the laser beam emitted from the semiconductor laser 1 is lower than a reference level, then the output voltage from the comparator 12 is of a low level to operate the up/down counter 13 as an up counter. When a disable signal applied from an edge detector 14 to the up/down counter 13 is removed by a timing signal $T_1$, the up/down counter 13 counts up clock signals from an oscillator 15. A count output from the up/down counter 13 is converted by a digital-to-analog converter 16 to an analog quantity which is aplied to the semiconductor laser driver 8. The semiconductor laser driver 8 drives the semiconductor laser 1 with the information signal from the signal processing circuit 7, the information signal or drive current being variable by the output signal from the digital-to-analog converter 16. Therefore, as the count of the up/down counter 13 gradually increases, the intensity of the laser beam from the semiconductor laser 1 is also gradually increased to increase the output from the amplifier 11. When the output from the comparator 12 is changed from the low level to the high level, the edge detector 14 detects a positive-going edge of the output signal from the comparator 12 to apply a disable signal to the up/down counter 13. The up/down counter 13 is now placed in a disable mode to hold the count, so that the magnitude of the drive current for the semiconductor laser 1 remains maintained. Then, the timing signal $T_1$ is applied to the edge detector 14 to release the up/down counter 13 of the disable mode. If at this time the output signal of the comparator 12 is of the high level (the output intensity of the semiconductor laser 1 is large), then the up/down counter 13 operates as a down counter to count down clock signals from the oscillator 15. The output from the digital-to-analog converter 16 is now decreased to reduce the drive current for the semiconductor laser 1, thus lowering the output from the amplifier 11. When the output from the amplifier 11 becomes smaller than the reference voltage Vre, the output signal from the comparator 12 is changed from the high level to the low level. The edge detector 14 then detects a negative-going edge of the output of the comparator 12 to put the up/down counter 13 in the disable mode. The up/down counter 13 holds its count, and hence the magnitude of the drive current for the semiconductor laser 1 remains the same.

A laser printer or the like in which the semiconductor laser 1 is incorporated is subjected to an ambient temperature suffering from gradual temperature changes. Therefore, any variations in the radiating output from the semiconductor laser due to the influence of thermal capacities of the semiconductor laser and its attachments may be negligible in a short period of time. The timing signal $T_1$ may for example be a print-start signal generated each time the laser printer starts its recording mode or a power-on reset signal applied when the power supply of the laser printer is switched on, for reducing variations in the radiating output from the semiconductor laser to produce recorded images of high quality.

As described above, the radiating output from the semiconductor laser is detected by the photodetector and compared with the reference signal by the comparator, the output of which is employed to control the count modes of the up/down counter. The count output from the up/down counter is converted by the digital-to-analog converter into an analog quantity, and a current proportional to the analog quantity is supplied to the semiconductor laser. The current supplied to the semiconductor laser is controlled and maintained so that both inputs to the comparator are equalized to each other at all tiems. With this arrangement, the photodetector employed may be of a relatively low response speed, and the controlling device may therefore be of a reduced cost and economical.

Figure 3:
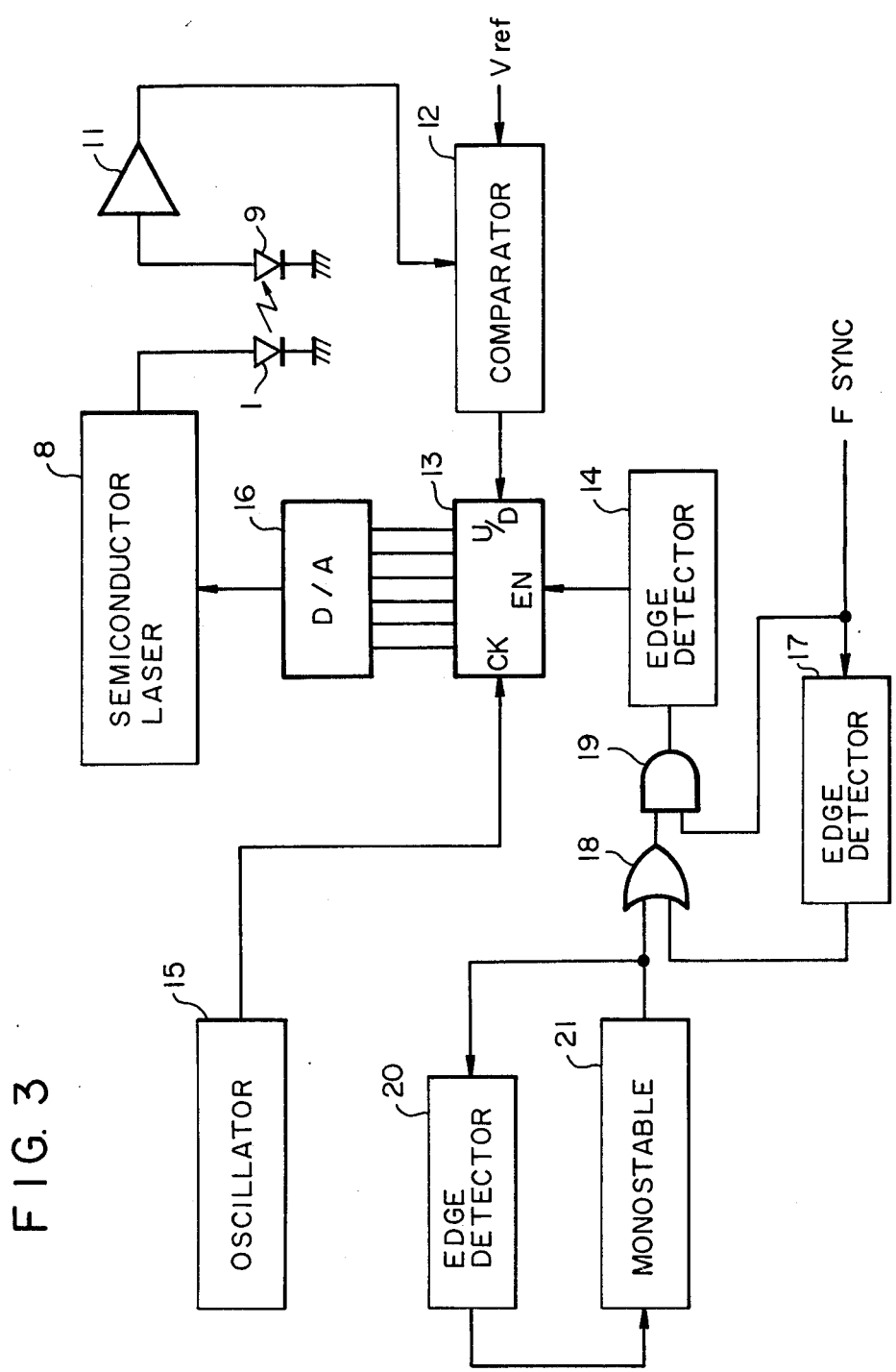
FIG. 3 is a block diagram of a device for controlling the radiating output of a semiconductor laser according to an embodiment of the present invention.
Figure 4:
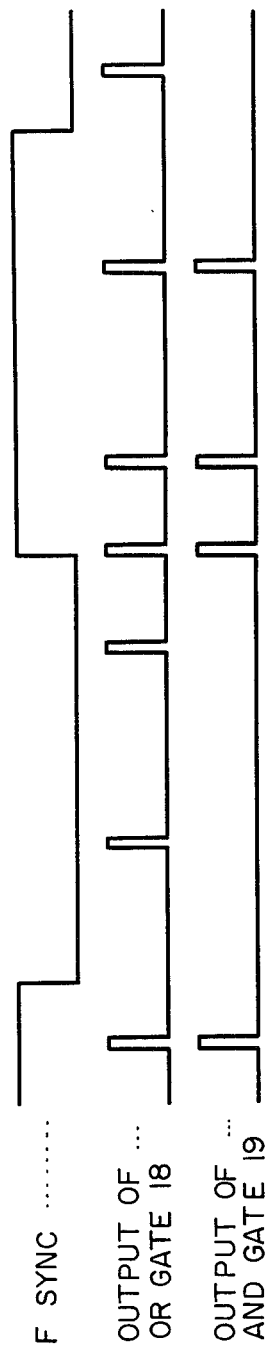
FIG. 4 is a timing chart of signals produced in the controlling device shown in FIG. 3.

FIG. 3 illustrates a device for controlling the radiating output of a semiconductor laser according to an embodiment of the present invention, the controlling device being used in a laser printer, for example. FIG. 4 is a timing chart of signals produced in the controlling device of FIG. 3.

According to the embodiment of FIGS. 3 and 4, a timing signal $T_1$ is applied to the edge detector 14 in each period of time even during a standby mode. A frame synchronizing signal FSYNC is of a low level during a frame recording period, and is applied to an edge detector 17 which detects positive-going edges of the frame synchronizing signal FSYNC. An output signal from the edge detector 17 is passed through an OR gate 18 and then an AND gate 19 by the frame synchronizing signal FSYNC, and is fed as a timing signal to the edge detector 14. An edge detector 20 detects a positive-going edge of an output signal from a monostable multivibrator 21 and triggers the monostable multivibrator 21 to cause the same to produce a pulse at each interval of time (a few seconds, for example). The pulse from the monostable multivibrator 21 is also passed through the AND gate 19 by the frame synchronizing signal FSYNC and fed as a timing signal to the edge detector 14. Therefore, not only the up/down counter 13 is released from the disable mode when the frame synchronizing signal FSYNC goes low, but also the laser printer is released from the standby mode at intervals of time T while the laser printer is in the standby mode. The drive current for the semiconductor laser 1 is therefore controlled at the intervals of time T even in the standby mode, so that variations in the radiating output from the semiconductor laser 1 can be reduced.

Figure 6:
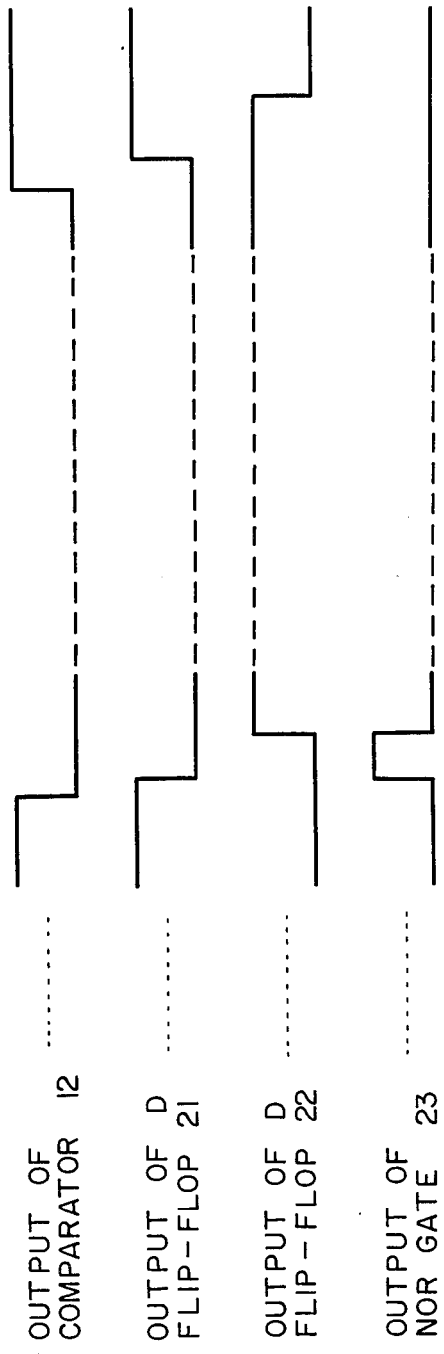
FIG. 6 is a timing chart of signals produced in the controlling device shown in FIG. 5.
Figure 5:
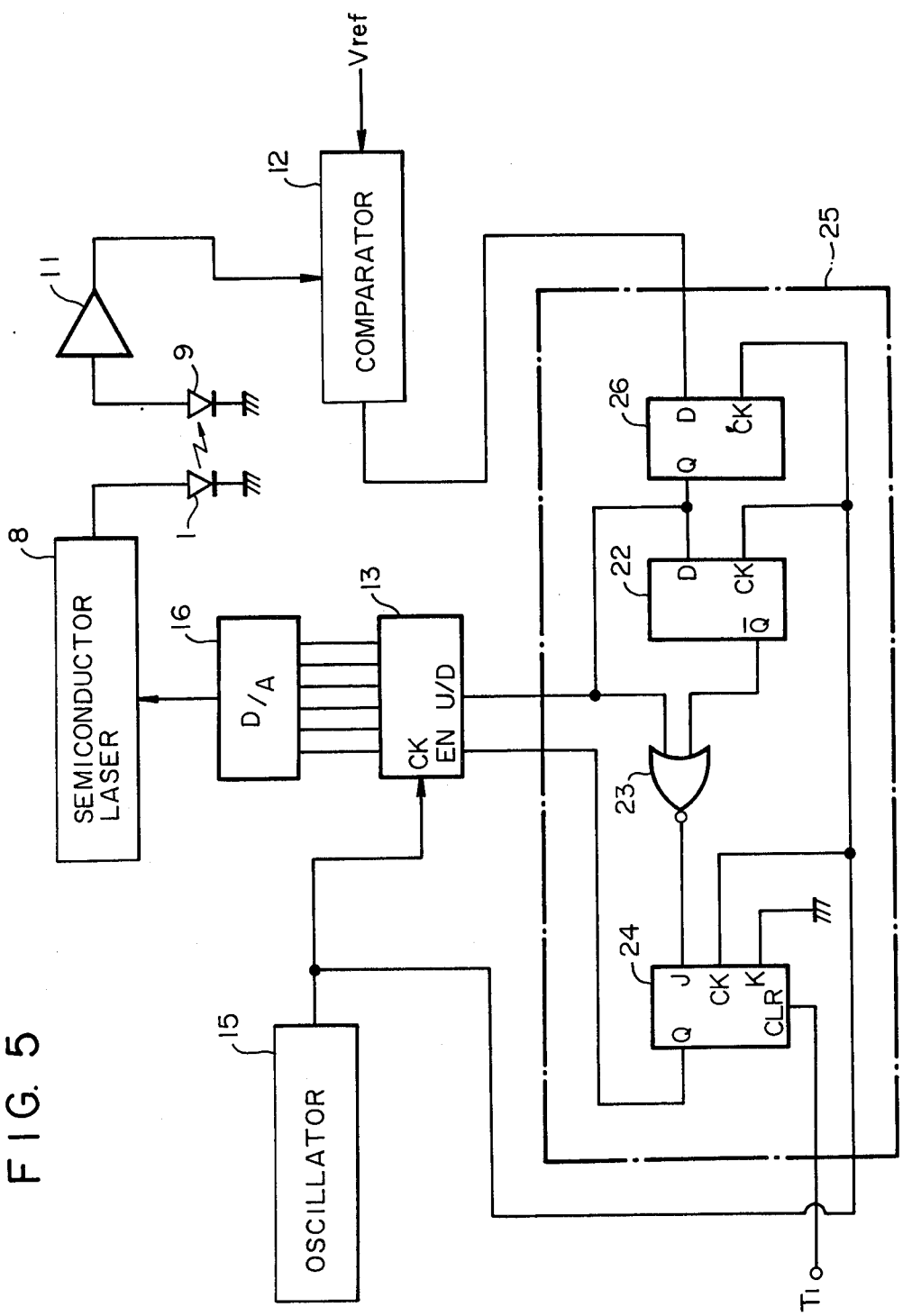
FIG. 5 is a block diagram of a device for controlling the radiating output of a semiconductor laser according to another embodiment of the present invention.

FIG. 5 shows a device for controlling the radiating output of a semiconductor laser according to another embodiment of the present invention, the controlling device being used in a laser printer, for example. FIG. 6 is a timing chart of signals produced in the controlling device of FIG. 5.

The controlling device of the embodiment of FIGS. 5 and 6 includes an edge detector 25 composed of a D flip-flops 22, 26, a NOR gate 23, and JK flip-flop 24. In response to a timing signal $T_1$ applied to the edge detector 25, the JK flip-flop 24 is cleared by the timing signal $T_1$ to produce an output signal of a low level for thereby releasing the up/down counter 13 from a disable condition. An output signal from the comparator 12 is latched by the D flip-flop 26 in response to a clock signal from the oscillator 15. An output signal from the D flip-flop 26 is applied as a count mode signal to the up/down counter 13 to control the count modes thereof and is also latched by the D flip-flop 22 in response to the clock signal from the oscillator 15. The non-inverted output from the D flip-flop 26 and an inverted output from the D flip-flop 22 are supplied to the NOR gate 22, which produces an output signal to set the JK flip-flop 24. When the JK flip-flop 24 is cleared by the timing signal $T_1$ to release the up/dpwn counter 13 from the disable mode while the output from the comparator 12 is of a high level (the radiating output from the semiconductor laser 1 is higher than a reference level), the up/down counter 13 is caused to operate as a down counter by a high-level output from the D flip-flop 26. The drive current for the semiconductor laser 1 is therefore reduced to lower the output voltage from the amplifier 11. When the output from the comparator 12 is changed from the high level to the low level, the output from the D flip-flop 26 goes low to enable the output of the NOR gate 23 to go high. The JK flip-flop 24 is now set to disable the up/down counter 13. When the JK flip-flop 24 is cleared by the timing signal $T_1$ to release the up/dpwn counter 13 from the disable mode while the output from the comparator 12 is of a low level (the radiating output from the semiconductor laser 1 is lower than the reference level), the up/down counter 13 is caused to operate as an up counter by a low-level output from the D flip-flop 26. The drive current for the semiconductor laser 1 is therefore increased to increase the output voltage from the amplifier 11. When the output from the comparator 12 is changed from the low level to the high level, the output from the D flip-flop 26 goes low to high to cause the up/down counter 13 to operate as a down counter. At this time, the output from the NOR gate 23 remains low, failing to reset the JK flip-flop 24, so that the up/down counter 13 remains released from the disable mode. Therefore, the up/down counter 13 is not disabled when the radiating output from the semiconductor laser 1 is increased in excess of the reference level, but is disabled when the radiating output from the semiconductor laser 1 is lowered beyond the reference level. Consequently, the drive current held for the semiconductor laser 1 is kept constant at all times.

In the above embodiment, the up/down counter 13 is disabled when the radiating output from the semiconductor laser 1 is lowered beyond the reference level. However, the up/down counter 13 may be disabled when the radiating output from the semiconductor laser 1 is increased beyond the reference level.

Although certain preferred embodiments have been shown and described, it should be understood that many changes and modifications may be made therein without departing from the scope of the appended claims.

What is claimed is:

1. A device for controlling the radiating output of a semiconconductor laser, comprising:
   (a) a photodetector for detecting the radiating output of the semiconductor laser;
   (b) a comparator for comparing an output signal from said photodetector with a reference signal;
   (c) an up/down counter for counting clock signals in a count mode controlled by an output signal from said comparator;
   (d) a digital-to-analog converter for converting a count output from said up/down counter into an analog signal;
   (e) a semiconductor laser driver for supplying said semiconductor laser with a current proportional to the analog signal from said digital-to-analog converter; and
   (f) means for controlling and holding the current supplied to said semiconductor laser to equalize the input signals applied to said comparator.

2. A device according to claim 1, including means for ceasing the holding of said current supplied to said semiconductor laser.

3. A device for controlling the radiating output of a semiconconductor laser, comprising:
   (a) a photodetector for detecting the radiating output of the semiconductor laser;
   (b) a comparator for comparing an output signal from said photodetector with a reference signal;
   (c) an up/down counter for counting clock signals in a count mode controlled by an output signal from said comparator;
   (d) a digital-to-analog converter for converting a count output from said up/down counter into an analog signal;
   (e) a semiconductor laser driver for supplying said semiconductor laser with a current proportional to the analog signal from said digital-to-analog converter; and
   (f) an edge detector for releasing said up/down counter from a disable mode in response to a timing signal and for disabling said up/down counter in response to the detection of inversion of the output signal from said comparator in a predetermined direction.

* * * * *